United States Patent
Lee et al.

(10) Patent No.: US 7,030,451 B2
(45) Date of Patent: Apr. 18, 2006

(54) METHOD AND APPARATUS FOR PERFORMING NICKEL SALICIDATION

(75) Inventors: Pooi See Lee, Singapore (SG); Kin Leong Pey, Singapore (SG); Alex See, Singapore (SG); Lap Chan, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 11/081,908

(22) Filed: Mar. 15, 2005

(65) Prior Publication Data

US 2005/0156269 A1 Jul. 21, 2005

Related U.S. Application Data

(62) Division of application No. 09/726,903, filed on Nov. 29, 2000, now Pat. No. 6,890,854.

(51) Int. Cl.
  *H01L 29/78* (2006.01)
(52) U.S. Cl. .............. 257/413; 257/741; 257/754; 257/755; 148/33.3
(58) Field of Classification Search ............. 257/377, 257/382, 384, 412, 413, 754, 755, 741; 227/377; 148/33.3
See application file for complete search history.

(56) References Cited

U.S. PATENT DOCUMENTS 5,840,626 A * 11/1998 Ohguro ................ 438/649
6,090,653 A * 7/2000 Wu ........................ 438/231
6,110,842 A * 8/2000 Okuno et al. ............. 438/776
6,140,024 A * 10/2000 Misium et al. ............. 430/314
6,277,743 B1 * 8/2001 O'Brien ................... 438/682
6,346,465 B1 * 2/2002 Miura et al. .............. 438/542
6,406,743 B1 * 6/2002 Lee et al. ................. 430/630

* cited by examiner

*Primary Examiner*—George Fourson
*Assistant Examiner*—Joannie Adelle Garcia
(74) *Attorney, Agent, or Firm*—Stattler Johansen & Adeli LLP

(57) ABSTRACT

A method and apparatus for performing nickel salicidation is disclosed. The nickel salicide process typically includes: forming a processed substrate including partially fabricated integrated circuit components and a silicon substrate; incorporating nitrogen into the processed substrate; depositing nickel onto the processed substrate; annealing the processed substrate so as to form nickel mono-silicide; removing the unreacted nickel; and performing a series procedures to complete integrated circuit fabrication. This nickel salicide process increases the annealing temperature range for which a continuous, thin nickel mono-silicide layer can be formed on silicon by salicidation. It also delays the onset of agglomeration of nickel mono-silicide thin-films to a higher annealing temperature. Moreover, this nickel salicide process delays the transformation from nickel mono-silicide to higher resistivity nickel di-silicide, to higher annealing temperature. It also reduces nickel enhanced poly-silicon grain growth to prevent layer inversion. Some embodiments of this nickel salicide process may be used in an otherwise standard salicide process, to form integrated circuit devices with low resistivity transistor gate electrodes and source/drain contacts.

10 Claims, 4 Drawing Sheets

METHOD AND APPARATUS FOR PERFORMING NICKEL SALICIDATION

CLAIM OF BENEFIT TO PRIOR APPLICATION

This patent application claims benefit to and is a divisional of United States Patent Application entitled "Method and Apparatus for Performing Nickel Salicidation," having Ser. No. 09/726,903, filed on Nov. 29, 2000, now U.S. Pat. No. 6,890,854, which is incorporated herein by reference.

FIELD OF THE INVENTION

This invention is directed towards fabrication of integrated circuits, and particularly toward a method and apparatus for performing nickel salicidation.

BACKGROUND OF THE INVENTION

Resistance of interconnect lines (such as source/drain interconnect lines) plays a significant role in controlling the speed of ultra large-scale integration (ULSI) devices. A self-aligned silicide process (typically referred to as a salicide process) is often used to reduce the resistance of interconnect lines. A salicide process employs metal layer deposition and subsequent annealing to cause a reaction between the metal and underlying silicon. This reaction consumes the metal and some of the silicon, forming a low resistivity metal silicide layer in their place.

Nickel is an attractive candidate for use in a salicide process. Nickel can react with silicon to form low resistivity nickel mono-silicide as the salicidation product. Nickel mono-silicide can be formed during a one-step, low-temperature annealing process. Nickel mono-silicide has low silicon consumption during salicidation. In addition, nickel mono-silicide sheet resistance does not depend upon device linewidth. Thus, a well-controlled nickel salicide process could be used to form low resistivity gate electrodes and source/drain contacts in an integrated circuit device.

One prior art nickel silicidation process is described by S. R. Das et al., Mat. Res. Soc. Symp. Proc., 427, 541 (1996). This process comprises depositing nickel onto polycrystalline silicon (poly-silicon), and subsequently annealing the sample. During annealing, nickel reacts with silicon to form nickel silicide. However, the reaction product is not a uniform thin nickel silicide film on the surface of the poly-silicon layer. Nickel enhances poly-silicon grain growth near the surface of the poly-silicon layer. Rapid poly-silicon grain growth causes layer inversion, wherein some poly-silicon grows on top of the nickel silicide layer. The resulting nickel silicide layer is not uniform and flat.

A second prior art nickel silicidation process is described by S. Nygren et al., Appl. Surf. Sci., 53, 57 (1990). This process comprises depositing nickel on single crystal silicon, and subsequently annealing the sample. During annealing, nickel reacts with silicon to form nickel silicide. However, the thin nickel silicide film agglomerates during the annealing process, forming a discontinuous island structure on the surface of the silicon substrate. Some nickel monosilicide also transforms to higher resistivity nickel di-silicide.

A third prior art process is described by W. T. Sun et al., IEEE Trans. Elec. Dev., 45, 9 (1998). This process comprises: (1) implanting poly-silicon with nitrogen ions; (2) depositing cobalt on poly-silicon; and (3) annealing the sample twice. During annealing, cobalt reacts with silicon to form cobalt silicide. Nitrogen ion implantation inhibits agglomeration and inhibits transformation from cobalt mono-silicide to lower resistivity cobalt di-silicide. Unfortunately, this process also increases cobalt di-silicide resistivity and requires a two step annealing process.

A fourth prior art process is described by L. W. Cheng et al., Thin Solid Films, 355–356, 412 (1999). In this process, a single crystal silicon substrate is implanted with nitrogen ions prior to doping the source/drain junction. Additional procedures including doping the source/drain junction, depositing nickel onto silicon, and annealing the sample are then performed. Nitrogen ion implantation is found to slow down dopant diffusion and delay transformation from nickel mono-silicide to nickel di-silicide during the high temperature annealing. This process controls dopant transport in shallow source/drain junctions in silicon, but does not improve silicidation of nickel on poly-silicon device structures such as gates. Furthermore, source/drain dopants (particularly Boron) were poorly activated.

Nitrogen has also been used to improve nickel silicidation, in a fifth prior art process described by T. Ohguro et al., IEDM, 453 (1995). This process comprises sputter-depositing nickel onto a single crystal silicon substrate, using a nitrogen containing sputter gas, and then annealing the sample at 400° C. During annealing, nickel reacts with silicon to form nickel mono-silicide. This process forms a uniform nickel mono-silicide thin-film on the surface of the single crystal silicon substrate, without agglomeration. However, this process is difficult to control due to complications, such as non-uniform nitrogen gas pressure within a sputter chamber. This process also does not incorporate nitrogen into the silicon to prevent grain growth in poly-silicon containing substrates.

The prior art processes do not provide a well-controlled way to form a uniform thin nickel mono-silicide film on top of single crystal and polycrystalline silicon. In addition, these processes are difficult to integrate into a nickel salicidation process for high density integrated circuit devices.

There is therefore a need in the art for a nickel salicide process that forms a uniform nickel mono-silicide thin-film on single crystal and polycrystalline silicon underlayers. Ideally, this method should (1) form nickel mono-silicide under a broad range of annealing temperatures; (2) form nickel mono-silicide without further transformation to higher resistivity nickel di-silicide; (3) restrict grain growth in nickel mono-silicide to prevent thin-film agglomeration; and (4) restrict silicide enhanced grain growth in poly-silicon to prevent layer inversion. This method should also be compatible with standard processing of source/drain contacts, gate electrodes, and interconnects in high density integrated circuit devices.

SUMMARY OF THE INVENTION

Some embodiments of the invention utilize a nickel salicide process that forms low resistivity gate electrodes and source/drain contacts. These embodiments incorporate nitrogen into the silicon substrate prior to the nickel deposition. The incorporated nitrogen improves uniformity and continuity of thin nickel mono-silicide films that are formed on single crystal and polycrystalline silicon. This nickel salicide process minimizes changes to standard CMOS salicide processes so as to optimize manufacturability and minimize additional cost during fabrication of a wide range of integrated circuit devices.

In these embodiments, a series of integrated circuit fabrication procedures is performed, to form a processed substrate including partially fabricated integrated circuit components on a silicon substrate. These procedures typically include: forming dielectric regions in the silicon substrate that electrically isolate neighboring integrated circuit devices; doping portions of the silicon to form source/drain structures; depositing a gate dielectric material and a polycrystalline silicon gate material onto the silicon substrate and selectively etching; and depositing a dielectric material onto the silicon substrate and selectively etching to form dielectric spacers. These embodiments then incorporate nitrogen into the processed substrate. Some of the embodiments incorporate the nitrogen by ion implantation.

After the incorporation of the nitrogen, these embodiments anneal the processed substrate to reduce implantation defects. Nickel is then deposited on the processed substrate and subsequently annealed. During sample annealing, nickel reacts with silicon to form nickel mono-silicide. In some embodiments, a series of integrated circuit fabrication procedures is then performed, to finish the integrated circuit device processing. These integrated circuit fabrication procedures typically include: depositing a dielectric material onto the processed substrate and selectively etching; planarizing the processed substrate; and depositing metal onto the processed substrate and selectively etching to form metal lines.

BRIEF DESCRIPTION OF THE DRAWINGS

The objects, features, and advantages of the present invention will be apparent to one skilled in the art, in view of the following detailed description in which.

DETAILED DESCRIPTION OF THE INVENTION

This invention is directed towards a method and apparatus for performing nickel salicidation. In the following description, for purposes of explanation, specific nomenclature is set forth to provide a thorough understanding of the present invention. However, it will be apparent to one skilled in the art that these specific details are not required in order to practice the present invention.

Some embodiments of the invention use a nickel salicide process that forms uniform, thin nickel mono-silicide films on silicon. Some embodiments of the nickel salicide process implant nitrogen ions into silicon prior to nickel metal deposition and annealing. These embodiments may be used in an otherwise standard salicide process, to form low resistivity integrated circuit transistor devices such as gate electrodes and source/drain contacts.

Figure 1:
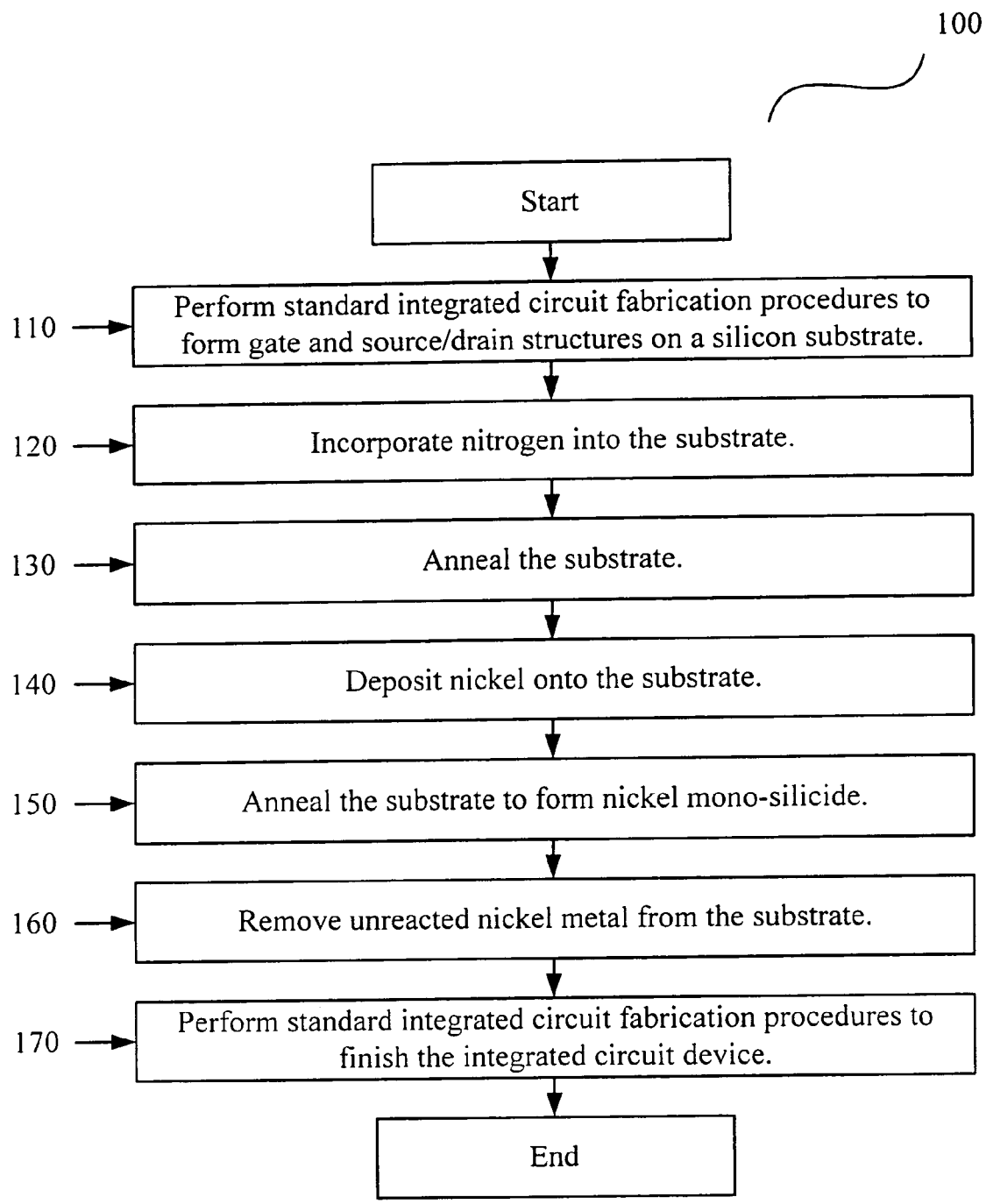
FIG. 1 illustrates a flowchart of one embodiment of a nickel salicide process to fabricate integrated circuit devices with low resistivity gate electrodes and source/drain contacts.

FIG. 1 illustrates a flowchart of a process 100 used by some embodiments of the invention. This process 100 forms nickel mono-silicide on poly-silicon gate structures and on silicon source/drain structures. As shown in FIG. 1, the process 100 (1) performs (at 110) a series of standard integrated circuit fabrication procedures to form gate and source/drain structures; (2) incorporates (at 120) nitrogen into the silicon; (3) anneals (at 130) the silicon substrate to reduce defects and drive nitrogen into the silicon substrate; (4) deposits (at 140) nickel metal onto the silicon substrate; (5) anneals (at 150) the silicon substrate to drive a salicidation reaction that consumes nickel and silicon, and forms nickel mono-silicide; (6) removes (at 160) unreacted nickel metal; and (7) performs (at 170) standard integrated circuit fabrication procedures to finish the integrated circuit device processing.

Figure 2A:
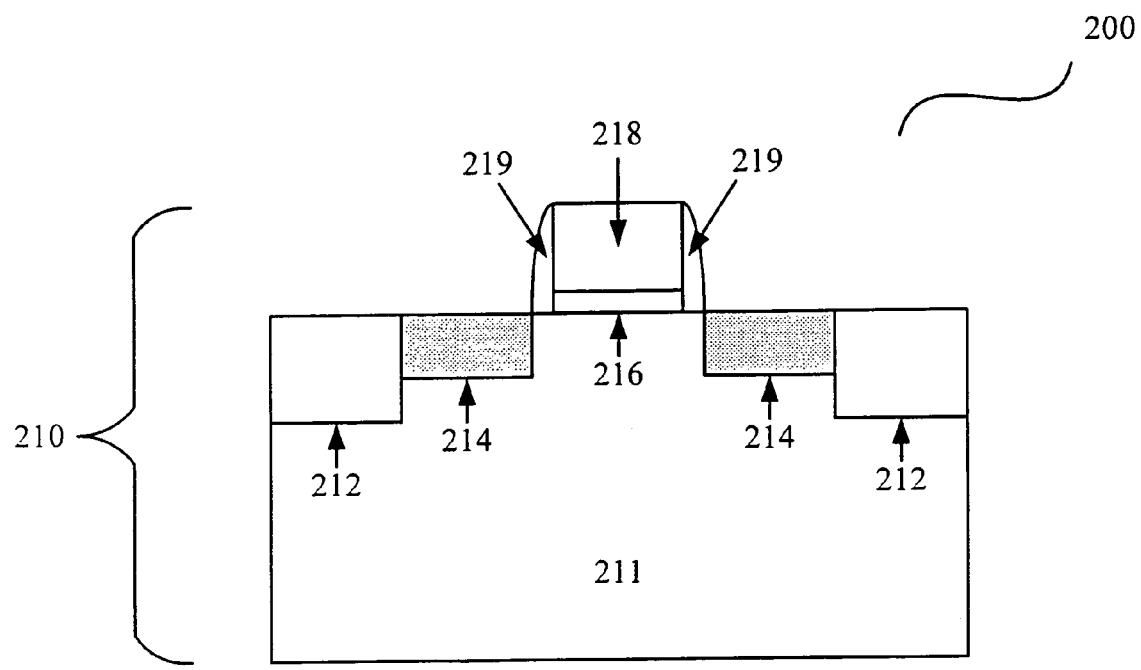
FIG. 2a illustrates a cross-section of the processed substrate after integrated circuit gate and source/drain structures have been formed on the silicon substrate.

Each of the operations of process 100 will now be further described by reference to FIGS. 2a–2f. FIG. 2a illustrates a cross-section of an integrated circuit device 210 that process 100 forms at 110. As shown in FIG. 2a, the integrated circuit device 210 includes: (1) a silicon substrate 211; (2) substrate dielectric regions 212; (3) silicon source/drain structures 214; (4) a gate dielectric layer 216; (5) a polycrystalline silicon gate structure 218; and (6) dielectric spacers 219.

In some embodiments, the process 100 forms (at 110) integrated circuit device 210 and other devices on silicon substrate 211 by using a series of standard integrated circuit fabrication procedures. For instance, substrate dielectric regions 212 of the integrated circuit device 210 can be formed in the silicon substrate 211 by an isolation process, such as shallow trench isolation, LOCOS isolation or PBLOCOS isolation. The substrate dielectric regions 212 electrically isolate device components within the silicon substrate 211, (e.g., they isolate the source and drain structures from neighboring integrated circuit devices).

The device's source/drain structures 214 can be formed by n-type or p-type doping selected regions of the silicon substrate 211, to give desired electrical transport properties. In addition, the gate dielectric layer 216 and poly-silicon gate structure 218 can be formed by blanket deposition of each material onto the silicon substrate 211, followed by selective etching. Gate dielectric layer 216 isolates poly-silicon gate structure 218 from the silicon substrate 211. Dielectric spacers 219 are formed by deposition of a dielectric material onto the silicon substrate 211, followed by selected etching. These dielectric spacers 219 isolate the gate structure 218 from the source/drain structures 214 and subsequent metallization.

Figure 2B:
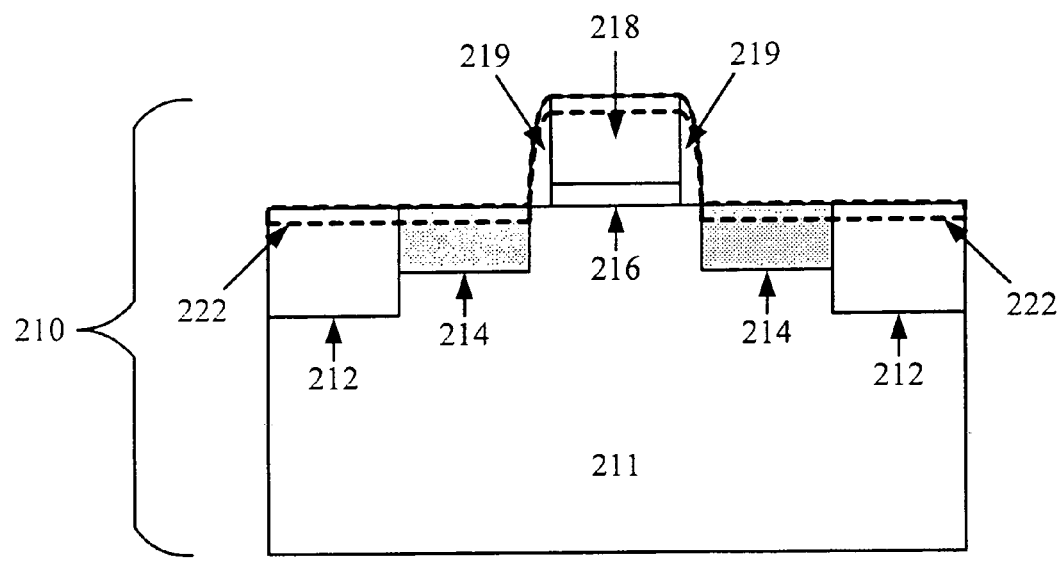
FIG. 2b illustrates the cross-section of FIG. 2a after nitrogen has been incorporated into the substrate.

FIG. 2b illustrates nitrogen 222 that the process 100 incorporates (at 120) on the top of the integrated circuit device 210. In some embodiments, this nitrogen 222 is incorporated by implanting nitrogen ions into regions of the integrated circuit device 210 (e.g. source/drain structures 214 and the gate structure 218). In some embodiments, implanting nitrogen ions comprises blanket $N_2^+$ ion implantation, with a dosage between $2*10^{14}/cm^2$ and $2*10^{16}/cm^2$, and an ion energy between 15 keV and 50 keV. This provides an implanted region ~100–300 Å thick, as shown schematically by the dark dashed line region 222. In other embodiments, implanted nitrogen ions may have another structure (such as $N^+$), or may be implanted only into selected regions of the integrated circuit device 210. Nitrogen ion implanted region 222 is normally much shallower than the doped source/drain structures 214 (~1 μm thick) or the substrate dielectric 212 (>1 μm thick). Nitrogen may also be incorporated by other means such as diffusion doping or deposition of material in a nitrogen containing atmosphere.

When ion implantation is used to incorporate nitrogen into the integrated circuit device 210, it may be advantageous to anneal (at 130) the integrated circuit device 210, to remove defects caused by the ion implantation. In some embodiments, rapid thermal processing at a temperature between 800° C. and 1000° C., for a duration of between 30 seconds and 60 seconds, removes implantation defects with very little "drive-in diffusion" of nitrogen.

Figure 2C:
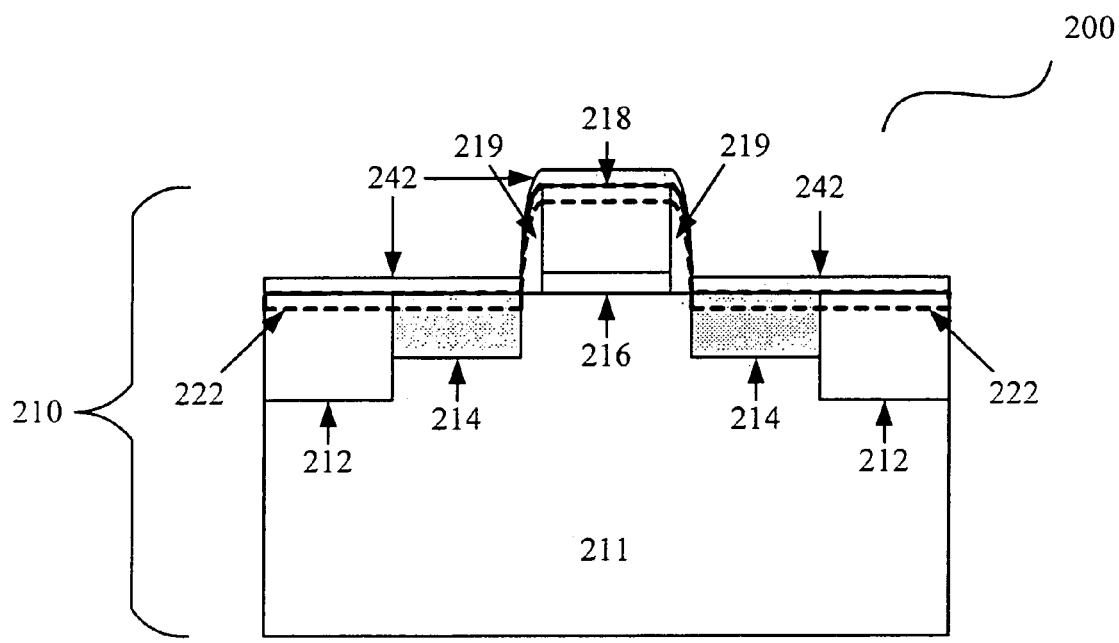
FIG. 2c illustrates the cross-section of FIG. 2b after nickel has been deposited onto the substrate.

FIG. 2c illustrates a nickel metal layer 242 that the process 100 deposits (at 140) on top of the integrated circuit device 210. In some embodiments the nickel metal layer 242 is formed by first applying a dilute hydrogen fluoride solution to the integrated circuit device 210, for cleaning and removal of surface oxide and water. Then, 100–300 Å of nickel is sputter deposited onto the integrated circuit device 210, to provide a nickel metal layer 242 appropriate for nickel salicidation.

Figure 2D:
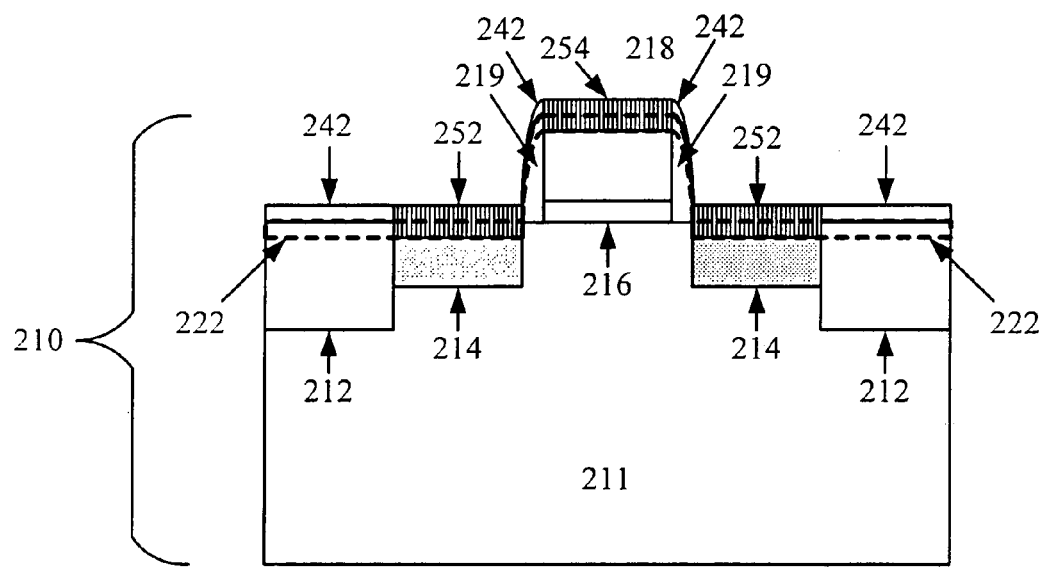
FIG. 2d illustrates the cross-section of FIG. 2c after nickel mono-silicide has been formed on the silicon.

FIG. 2d illustrates nickel mono-silicide layers (252 and 254) that the process 100 forms (at 150) on top of the integrated circuit device 210. In some embodiments, the nickel mono-silicide layers 252 are formed by a nickel salicidation reaction at the interface between the silicon source/drain structures 214 and the nickel metal regions 242 (shown in FIG. 2c). This salicidation reaction consumes selected nickel metal regions 242 and part of the silicon source/drain structures 214, and forms nickel mono-silicide layers 252 on top of the silicon source/drain structures 214. In some embodiments, the salicidation reaction is driven by one-step rapid thermal processing at a temperature between 400° C. and 800° C.

A nickel mono-silicide region 254 is similarly formed at the interface between the polycrystalline silicon gate structure 218 and the nickel metal region 242 (shown in FIG. 2c). The salicidation reaction consumes the selected nickel metal region 242 and part of the silicon gate structure 218. This reaction forms a nickel mono-silicide layer 254 on top of the silicon gate structure 218.

The reaction to form the nickel mono-silicide layers (252 and 254) occurs in the silicon, forming a nickel mono-silicide layer having ~2.2 times the initial ~100–300 Å nickel metal layer thickness (i.e., ~220–660 Å thick). No reaction occurs at the interface between the nickel metal 242 and the dielectric material (e.g., 212 and 219), so some nickel metal 242 is still present in FIG. 2d.

Figure 2E:
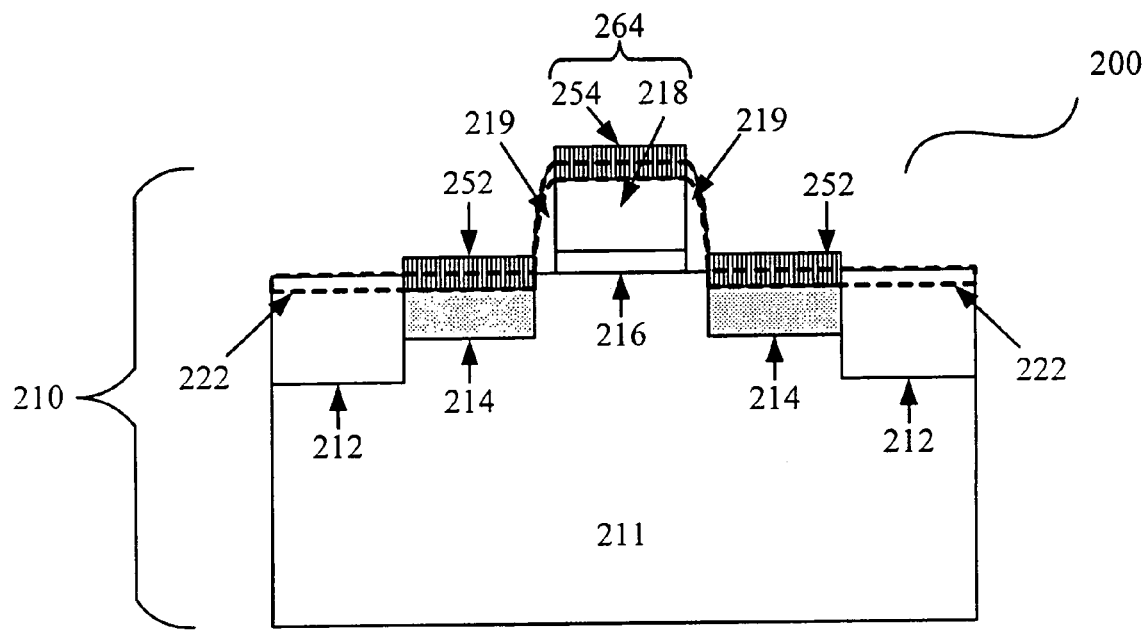
FIG. 2e illustrates the cross-section of FIG. 2d after nickel has been removed from the substrate.

FIG. 2e illustrates isolated source/drain contacts 262 and an isolated gate electrode 264 that the process 100 forms (at 160) on top of the integrated circuit device 210. In some embodiments, the source/drain contacts 262 and the gate electrode 264 are electrically isolated by removing the unreacted nickel metal 242 (shown in FIG. 2d). Nickel metal removal can be performed using a combination of etchants selected from reagents including sulfuric acid, hydrogen peroxide, nitric acid, hydrochloric acid and water. A solution of sulfuric acid, hydrogen peroxide and water; nitric acid and hydrochloric acid; or hydrochloric acid, hydrogen peroxide and water is typically used.

After 160, the top surface of the integrated circuit device 210 includes low resistivity source/drain contact 262, which comprises source/drain structure 214 and nickel mono-silicide region 252. The top surface of the integrated circuit device 210 also includes low resistivity gate contact 264, which comprises poly-silicon gate structure 218 and nickel mono-silicide region 254. These structures are isolated from each other by regions of dielectric material 212, 216 and 219.

Figure 2F:
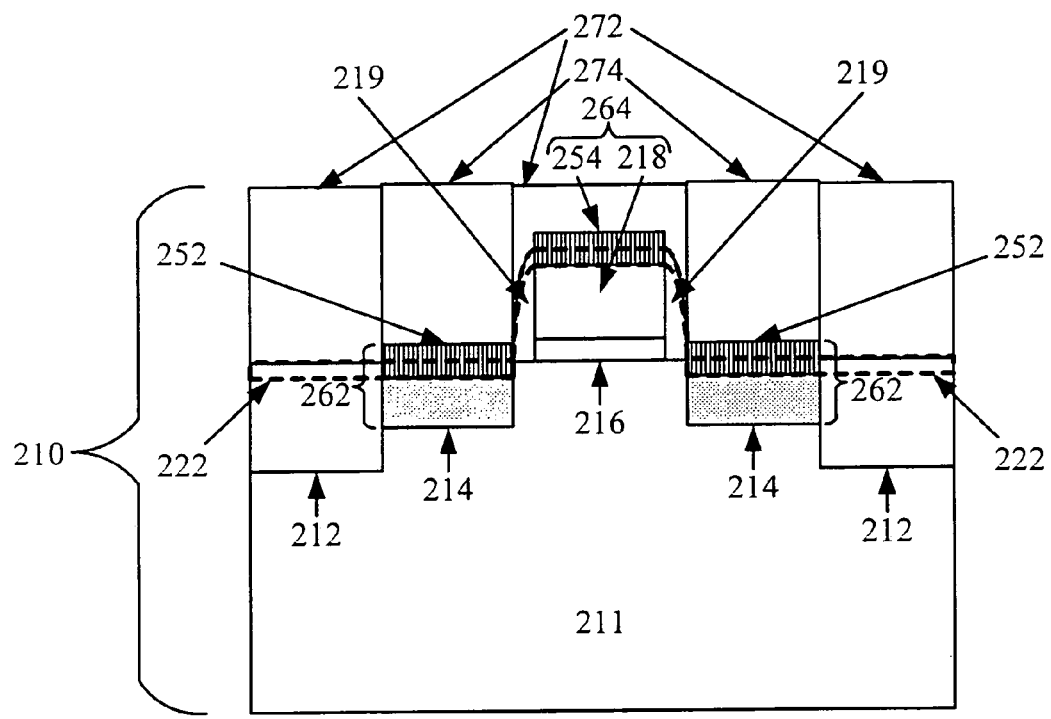
FIG. 2f illustrates the cross-section of FIG. 2e after dielectric isolation regions and a metal lines have been formed on the processed substrate.

FIG. 2f illustrates dielectric isolation regions 272 and metallization lines 274 that process 100 forms (at 170) on top of the integrated circuit device 210. In some embodiments, dielectric isolation regions 272 are formed by depositing the dielectric material BPSG onto the integrated circuit device 210, planarizing the device 210, and selectively etching regions of the BPSG. Then, metallization lines 274 are formed by depositing and selectively etching a metal such as aluminum or copper. Dielectric isolation regions 272 complete the electrical isolation of gate electrode 264 from other conducting materials. Metallization lines 274 electrically connect contacts such as source/drain contacts 262 of the integrated circuit device 210 to other integrated circuit devices.

The disclosed method and apparatus for nickel salicidation have several advantages. First, this nickel salicide process resists agglomeration during annealing by incorporating nitrogen into the nickel mono-silicide. Nitrogen incorporated into the nickel mono-silicide reduces nickel mono-silicide grain growth during substrate annealing, which makes agglomeration more difficult. This process also reduces agglomeration by incorporating nitrogen at the interfaces between nickel mono-silicide and poly-silicon, and between nickel mono-silicide and nickel. Nitrogen alters the interface energies and stabilizes the thin-film structure.

Second, this nickel salicide process resists inversion of the nickel mono-silicide and poly-silicon layers. Layer inversion is prevented by incorporating nitrogen into the poly-silicon. Nitrogen incorporated into the poly-silicon reduces nickel-enhanced poly-silicon grain growth at the interface between nickel and poly-silicon. Thus, poly-silicon grain growth does not penetrate through the nickel layer to cause layer inversion (e.g., layer inversion of poly-silicon gate structure 218 and gate nickel mono-silicide region 254 shown in FIG. 2f).

Third, this nickel salicide process resists transformation from nickel mono-silicide to higher resistivity nickel di-silicide during substrate annealing. Transformation to nickel di-silicide is reduced by incorporating nitrogen into the nickel mono-silicide thin-film during salicidation. Nitrogen incorporated into the nickel mono-silicide inhibits formation of nickel di-silicide from nickel mono-silicide, so that a pure nickel mono-silicide phase is maintained at higher substrate annealing temperatures.

In addition, this nickel salicide process is compatible with relatively low temperature integrated circuit fabrication processes and minimizes changes to standard salicide processes. This optimizes manufacturability and minimizes additional cost. Hence, embodiments of this invention can be used to fabricate integrated circuit devices that have low resistivity source/drain contacts and gate electrodes.

The foregoing has described a new method and apparatus for performing nickel salicidation. While the invention has been described by reference to numerous specific details, one of ordinary skill in the art will recognize that the invention can be embodied in other specific forms without departing from the spirit of the invention. For instance, the embodiments described above perform nickel salicidation on source/drain and gate transistor devices. Other embodiments of the invention perform nickel salicidation on different transistor devices. Thus, one of ordinary skill in the art would understand that the invention is not to be limited by the foregoing illustrative details, but rather is to be defined by the appended claims.

We claim:

1. An integrated circuit device comprising:
   processed substrate comprising;
      a silicon substrate;

a single crystal silicon integrated circuit component structure;

a polycrystalline silicon integrated circuit component structure; and nitrogen incorporated into said processed substrate, the processed substrate being formed by annealing the processed substrate after the nitrogen is incorporated; and nickel mono-silicide on top of said processed substrate, the nickel mono-silicide being formed by depositing nickel onto said processed substrate after annealing the processed substrate.

2. The apparatus as claimed in claim 1, wherein said single crystal silicon integrated circuit component structure comprises a source/drain structure and said polycrystalline silicon integrated circuit component structure comprises a gate structure.

3. The apparatus as claimed in claim 2, wherein said nitrogen is incorporated into said gate structure and said source/drain structure by doping said gate structure and said source/drain structure with nitrogen.

4. The apparatus as claimed in claim 2, wherein said nitrogen is incorporated into said gate structure and said source/drain structure by implanting nitrogen ions.

5. The apparatus as claimed in claim 4, wherein said implanting nitrogen ions comprises a blanket $N_2^+$ implantation of said silicon substrate.

6. The apparatus as claimed in claim 5, wherein said blanket $N_2^+$ implantation comprises implanting ions with a dosage between $2*10^{14}/cm^2$ and $2*10^{16}/cm^2$, and an ion energy between 15 keV and 50 keV.

7. The apparatus as claimed in claim 2, wherein defects in said source/drain structure and said gate structure are removed by rapid thermal processing said silicon substrate at a temperature between 800° C. and 1000° C., for a duration of between 30 seconds and 60 seconds.

8. The apparatus as claimed in claim 1, wherein said nickel mono-silicide comprises a 220–660Å thin-film formed by:

applying a solution including hydrogen fluoride to said silicon substrate;

sputter depositing nickel onto said integrated circuit component structures;

annealing said silicon substrate by one step rapid thermal processing at a temperature between 400° C. and 800° C.; and removing unreacted nickel metal.

9. The apparatus as claimed in claim 2, wherein said nickel mono-silicide on top of said gate structure comprises a low resistivity gate electrode that is electrically isolated from said nickel mono-silicide on top of said source/drain structure that comprises a low resistivity source/drain contact.

10. The apparatus as claimed in claim 1, wherein the nickel mono-suicide on top of said processed substrate is formed by annealing said processed substrate after the nickel is deposited onto said processed substrate.

* * * * *